(12) United States Patent
Shifren et al.

(10) Patent No.: US 9,093,469 B2
(45) Date of Patent: *Jul. 28, 2015

(54) ANALOG TRANSISTOR

(71) Applicant: SuVolta, Inc., Los Gatos, CA (US)

(72) Inventors: Lucian Shifren, San Jose, CA (US); Scott E. Thompson, Gainesville, FL (US); Paul E. Gregory, Palo Alto, CA (US)

(73) Assignee: Mie Fujitsu Semiconductor Limited, Kuwana, Mie (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/273,938

(22) Filed: May 9, 2014

(65) Prior Publication Data
US 2014/0248753 A1    Sep. 4, 2014

Related U.S. Application Data

(60) Continuation of application No. 13/553,902, filed on Jul. 20, 2012, now Pat. No. 8,748,270, which is a division of application No. 13/076,006, filed on Mar. 30, 2011, now abandoned.

(51) Int. Cl.
H01L 29/66    (2006.01)
H01L 21/8234  (2006.01)
(Continued)

(52) U.S. Cl.
CPC .. *H01L 29/66659* (2013.01); *H01L 21/823412* (2013.01); *H01L 21/823456* (2013.01);
(Continued)

(58) Field of Classification Search
CPC ............... H01L 21/823456; H01L 21/823412
USPC ............................ 438/275, 289; 257/E21.443
See application file for complete search history.

(56) References Cited

U.S. PATENT DOCUMENTS 3,958,266 A    5/1976  Athanas
4,000,504 A   12/1976  Berger
(Continued)

FOREIGN PATENT DOCUMENTS

EP    0274278    7/1988
EP    0312237    4/1989
(Continued)

OTHER PUBLICATIONS

Banerjee, et al. "Compensating Non-Optical Effects using Electrically-Driven Optical Proximity Correction", Proc. of SPIE vol. 7275 72750E, 2009.
(Continued)

*Primary Examiner* — Mary Wilczewski
*Assistant Examiner* — Toniae Thomas
(74) *Attorney, Agent, or Firm* — Baker Botts L.L.P.

(57) ABSTRACT

An analog transistor useful for low noise applications or for electrical circuits benefiting from tight control of threshold voltages and electrical characteristics is described. The analog transistor includes a substantially undoped channel positioned under a gate dielectric between a source and a drain with the undoped channel not being subjected to contaminating threshold voltage implants or halo implants. The channel is supported on a screen layer doped to have an average dopant density at least five times as great as the average dopant density of the substantially undoped channel which, in turn, is supported by a doped well having an average dopant density at least twice the average dopant density of the substantially undoped channel.

20 Claims, 10 Drawing Sheets

(51) Int. Cl.
*H01L 29/78* (2006.01)
*H01L 29/10* (2006.01)

(52) U.S. Cl.
CPC .......... *H01L29/105* (2013.01); *H01L 29/1045* (2013.01); *H01L 29/7835* (2013.01); *H01L 29/7836* (2013.01)

(56) References Cited

U.S. PATENT DOCUMENTS

| | | | |
|---|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |

(56) References Cited

U.S. PATENT DOCUMENTS

| | | |
|---|---|---|
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |

(56) References Cited

U.S. PATENT DOCUMENTS

| | | |
|---|---|---|
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,748,270 B1 * | 6/2014 | Shifren et al. ............ 438/275 |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | |
|---|---|---|
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |
| 2012/0242409 A1 | 9/2012 | Clark et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, Dk "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

(56) References Cited

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

* cited by examiner

ANALOG TRANSISTOR

CROSS REFERENCE TO RELATED APPLICATION

This application is a continuation of U.S. application Ser. No. 13/553,902, filed Jul. 20, 2012 which is a divisional application of U.S. application Ser. No. 13/076,006, filed Mar. 30, 2011 all of which are hereby incorporated herein by reference.

FIELD OF THE INVENTION

Improved analog transistors and manufacturing processes that are suitable for providing low noise and/or nanometer scale analog transistors for mixed signal, system on a chip, analog only, or other electronic die are described.

BACKGROUND

Like digital transistors, analog transistors have been available in decreasing sizes over time with transistor channel lengths that formerly were tens of thousands of nanometers being reduced a thousand-fold to a hundred nanometers or less in length. However, maintaining transistor quality and electrical characteristics for such downwardly scaled analog transistors is difficult at nanometer scales and can even be difficult for larger analog transistors useful in ultra-low signal or low noise applications. This is particularly true for mixed signal die that support both analog and digital transistors. Digital transistors and circuits benefit from design and processes that encourage tightly controlled on/off transistor switching while analog circuits often require transistors with linear response over a wide range of input/output conditions, improved $R_{out}$, or other electrical characteristics. In addition, analog circuits greatly benefit from analog transistors that have low thermal, shot, flicker, and/or burst noise levels as compared to transistors suitable for digital circuits and by analog transistor pairs (i.e. differential pair transistors) that have closely matched electrical properties, including in particular current-voltage response curves and threshold voltage.

Accordingly, cost effective transistor structures and manufacturing processes are needed for CMOS analog transistors alone or in combination with digital CMOS transistors. Such analog transistors must be reliable at nanometer scales and should not require expensive or unavailable tools or process control conditions. While it is difficult to balance the many variables that control transistor electrical performance, particularly when both analog and digital transistors must be manufactured on the same die with compatible processes, finding suitable transistor dopant structures and manufacturing techniques that result in acceptable noise and electrical characteristics are commercially valuable and necessary.

Having low noise and low variation in transistor characteristics is particularly useful for amplifier circuits. In a multi-stage analog amplifier circuit, noise output from the final stage can be almost entirely determined by noise generated in the initial stage of the analog amplifying transistors. Such noise created by the initial amplifying stage is carried along and amplified in later stages and can require incorporation of expensive hardware or software to support intensive filtering or noise rejection/compensation techniques. In another example, sense amplifiers are commonly used in digital solid state integrated circuit (IC) applications which require low voltage sensing. Sense amplifiers can be used in memory read circuits for memory bit sensing, in bus signal receivers, and interfacing with low voltage data paths in a processor. Typically, sense amplifiers are formed in the same IC die as the memory storage array and the processor data path. Normally, the inputs are considered analog while the outputs of a sense amplifier being full swing voltages can be digital. Such a conventional sense amplifier at its input has a source coupled matched differential pair, an active load such as a regenerative circuit to provide a full swing, and a current sink or source. However, as gate length and overall dimensions of transistors forming the input pair decrease, variations in the threshold voltage $V_t$ of the input FETs also increases. This leads to increased offset voltages in the input pair and the active load which reduces the sensitivity of the sense amplifier and again increases cost to create additional amplifying or noise rejection circuitry.

Transistor mismatch is of particular concern for systems on a chip (SoC) or other CMOS die having a bandwidth inversely proportional to the device capacitance. As more SoC require greater bandwidth for increasing communication requirements, more SoC analog circuitry is moving towards using logic type transistor devices for high-bandwidth applications since these devices are significantly smaller and hence have much smaller capacitance. However, while bandwidth increases as the size of the devices shrink, so does the $V_t$ mismatch between identical devices. This $V_t$ variation can result from process variations in line etch roughness, oxide thickness, or gate granularity but can also result from more fundamental limitations such as random dopant fluctuations in nanometer sized channels. Unfortunately, $V_t$ mismatch in small devices effectively reduces the headroom which the devices have to operate and can render the circuit useless. In order to achieve high-bandwidth SoC devices, $V_t$ mismatch and especially random dopant fluctuations need to be controlled and reduced.

SUMMARY

Suitable analog transistors, with improved electrical characteristics and having low noise and threshold voltage variation, include a gate having a gate dielectric and gate electrode positioned between a source and a drain. Typically, the analog transistors should have a substantially undoped channel having an average dopant density of less than $5 \times 10^{17}$ atoms per $cm^3$ positioned under the gate dielectric between the source and the drain. This can be created by epitaxial growth of intrinsic silicon, growth of another compatible channel material such as silicon germanium, atomic layer deposition, or other conventional process. Care should be taken during processing to prevent dopant migration, diffusion, or inadvertent dopant implant into the channel. Low temperature anneal and manufacture processes as well as haloless or significantly reduced halo dose processes that do not require a standard halo or pocket implant are preferred. Positioned below the substantially undoped channel is a screen layer doped to have an average dopant density at least twice as great as the average dopant density of the substantially undoped channel. Preferably, the screen layer has a dopant density ten to hundred times as great as the average dopant density of the substantially undoped channel and can be formed by epitaxial growth on, or implant into, a doped well. The doped well has an average dopant density less than the screen layer that is typically less than one-tenth to one-fiftieth the dopant density of the screen layer. In certain embodiments, threshold voltage of the analog transistor can be adjusted with a threshold voltage setting layer positioned between the substantially undoped channel and the screen layer and extending at least partially between the source and the drain. In other embodiments, precise dopant control and placement of the screen layer can be used to set threshold voltage while, in still other embodiments, selection of a gate metal helps to set a targeted transistor threshold voltage. Control of length and dopant density for lightly doped drain extensions is still another technique that can be used to modify transistor threshold voltage as is reduction or increase in gate/channel length. As will be appreciated, all of the forgoing threshold voltage adjustment techniques can be used alone or in combination with each other as required to meet analog transistor design specifications.

BRIEF DESCRIPTION OF THE DRAWINGS

For a more complete understanding of the present disclosure, reference is made to the following description taken in conjunction with the accompanying drawings, wherein like reference numerals represent like parts, in which.

DETAILED DESCRIPTION

Figure 1:
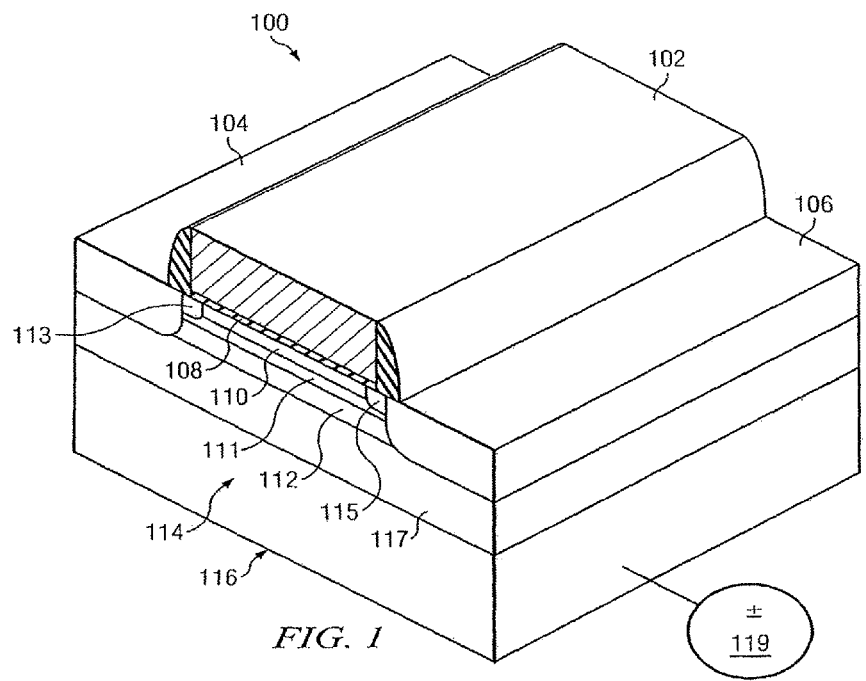
FIGS. 1 and 2 respectively illustrate perspective and side cross sectional views of an analog transistor having an undoped channel and screen layer to set depletion depth.
Figure 2:
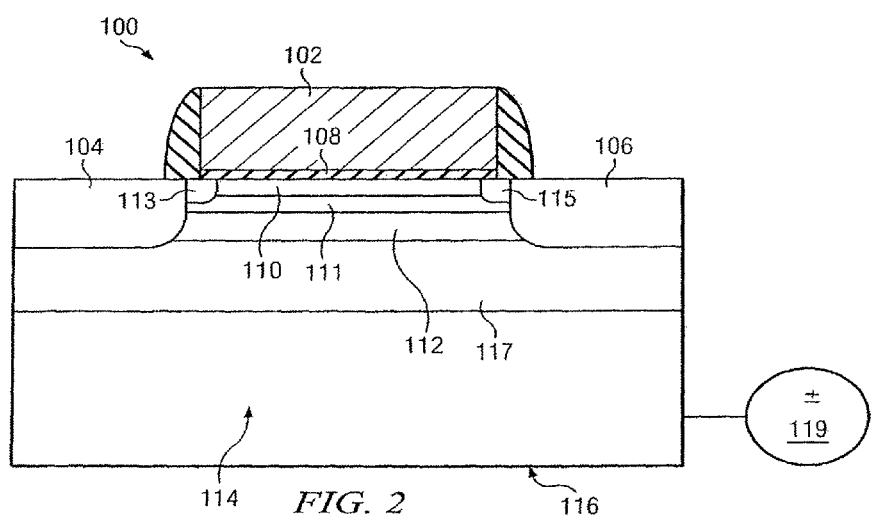

An improved analog transistor manufacturable on bulk CMOS substrates is seen in perspective view in FIG. 1 and side cross sectional view in FIG. 2. An analog Field Effect Transistor (FET) 100 is configured to have reduced noise, improved mobility, and decreased variation in threshold voltage due, in part, to minimization of channel dopants. The FET 100 has various optional and required structures, including a gate electrode 102, source 104, drain 106, and a gate dielectric 108 positioned over a substantially undoped channel 110. Lightly doped drain extensions (LDD) 113 and 115, positioned respectively adjacent to source 104 and drain 106, extend toward each other, reducing effective length of the undoped channel 110. These structures are supported by a substrate 116 which can include a lightly doped well 114, punch through suppression region 117, and a highly doped screen layer 112.

In this exemplary embodiment, the FET 100 is shown as an N-channel transistor having a source 104 and drain 106 made of N-type dopant material, formed upon a substrate as P-type doped silicon substrate providing a P-well 114 formed on a substrate 116. However, it will be understood that, with appropriate change to substrate or dopant material, a non-silicon P-type semiconductor transistor may be formed from other suitable substrates. The source 104 and drain 106 can be formed preferably using conventional dopant ion implantation processes and materials and may include, for example, modifications such as stress inducing source/drain structures, raised and/or recessed source/drains, asymmetrically doped, counter-doped or crystal structure modified source/drains, or implant doping of source/drain extension regions according to LDD (lightly doped drain) techniques.

The channel 110 contacts and extends between the source 104 and the drain 106 and supports movement of mobile charge carriers between the source and the drain. Preferably, the channel includes substantially undoped silicon having a dopant concentration less than $5\times10^{17}$ dopant atoms per cm$^3$ adjacent or near the gate dielectric 108. Channel thickness can typically range from 5 to 50 nanometers with exact thickness being dependent on desired transistor operating characteristics and transistor design node (i.e. a 20 nm gate length transistor will typically have a thinner channel thickness than a 45 nm gate length transistor). In certain embodiments the channel 110 is formed by epitaxial growth of pure or substantially pure silicon. Alternatively, silicon germanium or other suitable channel material can be used.

When gate electrode voltage is applied at a predetermined level, the entire volume of the undoped channel 110 is within a depletion zone, since channel depletion depth is a function of the integrated charge from dopants in the doped channel lattice, and the undoped channel 110 has very few dopants. The depletion region when voltage is applied to the gate normally extends from the gate dielectric through the undoped channel 110 and a short distance into the highly doped screen layer 112. While the channel 110 is substantially undoped, and positioned as illustrated above a highly doped screen layer 112, it may be surrounded vertically or laterally by simple or complex structures and layered with different dopant concentrations that can modify various transistor characteristics. These structures or doped layers can include a threshold voltage set layer 111 with a dopant concentration less than the screen layer 112, optionally positioned between the gate dielectric 108 and the screen layer 112 in the channel 110. The threshold voltage set layer 111 permits small adjustments in operational threshold voltage of the FET 100 while leaving the bulk of the channel 110 substantially undoped. In particular, that portion of the channel 110 adjacent to the gate dielectric 108 can remain undoped. Additionally, an optional punch through suppression region 117 is formed beneath the screen layer 112. Like the threshold voltage set layer 111, the punch through suppression region 117 has a dopant concentration less than the screen layer 112 while being higher than the overall dopant concentration of the lightly doped well 114 and substrate 116.

Overall improvement of noise and electrical characteristics for a transistor require careful trade-offs to be made in doping density, length, and depth of the foregoing transistor structures. Improvements made in one area, for example channel mobility, can be easily offset by adverse short channel effects or greater variability in capacitance or output resistance. One particularly critical parameter for analog and digital transistor design is the threshold voltage at which the transistor switches on or off. Threshold voltage in conventional polysilicon gate transistors is commonly set by directly implanting a "threshold voltage implant" into the channel, raising the threshold voltage to an acceptable level that reduces transistor off-state leakage while still allowing speedy transistor switching.

Transistor threshold voltage ($V_t$) in conventional transistors can also be modified by a technique variously know as "halo" implants, high angle implants, or pocket implants. Such implants create a localized graded dopant distribution near a transistor source and drain that extends into the channel. Halo implants are often required by transistor designers who want to reduce unwanted source/drain leakage conduction or "punch through" current but have the added advantage of adjusting threshold voltage. Unfortunately halo implants tend to introduce additional dopants into the channel. These additional dopants increase the variability of threshold voltage between transistors and decrease mobility and channel transconductance due to the adverse effects of dopant scattering centers in the channel. In addition, halo implants generally require at least two separate processing steps with the die wafer being rotated between different positions (e.g. 0, 90, 180 , or 270 degrees) and die with multiple transistor types can even require multiple separate halo implants. Since advanced die manufacturing processes currently require dozens of high angle implants, eliminating or greatly reducing the number of halo implants is desirable for reducing manufacture time and simplifying die processing. For transistors having poly gate structures, threshold voltage setting via halo implants also introduces additional variation in the threshold voltage, since at least a portion of the halo implant can travel through the corner of the poly gate. Since poly gate sidewall shape and crystal structure affect final location of halo dopants in the channel, unavoidable variation in poly gate edge shape and poly gate crystal structure will result in variations in threshold voltage. Such transistor variation can reduce performance of circuit and is of particular concern for paired analog transistors that rely on close matching of transistor characteristics for best performance.

Unfortunately, while useful for setting threshold voltage in conventional transistors, both halo implants and the threshold voltage implant into a previously undoped channel results in permanent contamination of the channel along with a consequent decrease in channel carrier mobility and increase in transistor variation (due to unavoidable variations in channel dopant density). To set threshold voltage to a desired range in FET 100, different threshold voltage modification techniques that do not rely on halo implants (i.e. haloless processing) can be used. This advantageously reduces cost of manufacture because halo implant process steps are not required, reduces the chance of failure due to misaligned halo implants, and eliminates unwanted contamination of the undoped channel. Haloless processing can be used alone, or in combination, with various other threshold voltage setting structures and techniques, including screen layer placement, positioning of intermediate threshold voltage set layers, gate metal selection, lightly doped drain geometry adjustments, and application of bias to the transistor well. Each of these modified structures and/or haloless processing techniques will be discussed in the following description.

As previously noted, the screen layer 112 is a highly doped layer that typically contains dopant atoms with a concentration of between $1\times10^{18}$ atoms per cm$^3$ and $1\times10^{20}$ atoms per cm$^3$, positioned under the channel 110 defined below the gate dielectric 108. P-type dopants such as boron are selected for screen layers of NMOS transistors while N-type dopants such as arsenic, antimony, or phosphorus can be selected for PMOS transistors. The presence of a screen layer below the undoped channel 110 is necessary to define a depletion zone beneath the gate. Generally, the greater the distance the screen layer 112 is positioned from the gate dielectric 108, the lower the threshold voltage and, conversely, the closer the screen layer 112 is to the gate dielectric 108, the higher the threshold voltage. As shown in FIGS. 1 and 2, the screen layer 112 can contact the source and drain or optionally can be positioned at a greater distance below the gate to avoid direct contact with the source and the drain (not shown). In certain embodiments, it may be formed as a blanket or sheet extending under multiple source/drain/channel regions (for example, as later discussed with respect to the embodiment of FIG. 4) while, in other embodiments, it may be a self-aligned implant or layer coextensive with the channel. The screen layer 112 thickness can typically range from 5 to 100 nanometers. The screen layer 112 is highly doped relative to the undoped channel 110, the threshold voltage set layer 111 (if provided), and the substrate supported well 114. The peak dopant concentration of the screen layer 112 can be five times or greater than the dopant concentration of the substantially undoped channel 110 with a relative concentration that can be between ten to a hundred times the dopant concentration of the undoped channel 110. In practice, the screen layer 112 is typically doped to have a near uniform concentration of between $5\times10^{18}$ atoms/cm$^3$ and $5\times10^{19}$ atoms/cm$^3$. However, embodiments in which the screen layer 112 has a complex dopant profile or reduces sharply in concentration from an initial spike are also contemplated. In certain embodiments, dopant migration resistant layers of carbon, germanium, or the like can be applied along with or above the screen layer 112 to prevent dopant migration into the optional threshold voltage set layer 111 and the undoped channel 110.

Typically, the screen layer 112 is formed by a tightly controlled implant into the well 114, but it can be formed as a separate epitaxially grown layer subjected to implant, in-situ doped, or any other conventional or known doping techniques.

As will also be appreciated, position, concentration, and thickness of the screen layer 112 are an important factor in transistor design. In certain embodiments, peak concentration of the screen layer 112 is near the edge of the depletion layer under the gate 102 and the screen layer 112 is located above the bottom of the source 104 and drain 106 junctions. Multiple delta doping implants, broad dopant implants, or long duration in-situ substitutional doping is preferred, since the screen layer 112 should have a finite thickness with 10 nm or greater being preferred. When transistors are configured to have the screen layer 112, the transistor can simultaneously have good threshold voltage matching, high output resistance, low junction leakage, good short channel effects, and still have an independently controlled and strong body effect. Simultaneous provision of these features is difficult for conventional transistors of a similar size. For example, conventional transistors with threshold voltage implants can provide good threshold voltage matching, but cannot simultaneously provide low junction leakage, an independently controlled body effect, or an independently controlled threshold voltage setting. In contrast, transistors designed to have an undoped channel 110, optional threshold voltage set layer ill (as discussed hereafter), and a thick and highly doped screen layer 112 can simultaneously provide all of the transistor device parameters required for implementation of complex multi-transistor SOC or multi-transistor analog integrated circuits.

Modifying threshold voltage by use of a threshold voltage set layer 111 positioned above the screen layer 112 and below the undoped channel 110 is an alternative technique to conventional threshold voltage implants for adjusting threshold voltage. Care must be taken to prevent dopant migration into the undoped channel 110 and thus use of low temperature anneals and transistor processing is recommended for many applications. The threshold voltage set layer 111 thickness can typically range from 2 to 20 nanometers. The threshold voltage set layer 111 is highly doped relative to the undoped channel 110 but is typically doped to a level one-half to one-tenth that of the screen layer 112. However, embodiments in which the screen layer 112 has complex dopant profile are also contemplated. Like the screen layer 112, in certain embodiments, dopant migration resistant layers of carbon, germanium, or the like can be applied along with or above the threshold voltage set layer 111 to prevent dopant migration into the undoped channel. The threshold voltage set layer 111 can be formed by out-diffusion from the screen layer 112 into an epitaxially grown layer, by implant or in-situ growth of an epitaxial layer on top of the screen layer 112, by delta doping to form an offset doped plane (as disclosed in pending U.S. patent application Ser. No. 12/895,785 filed Sep. 30, 2010, the entirety of which disclosure in herein incorporated by reference), or any other conventional or known doping techniques.

Yet another technique for modifying threshold voltage relies on selection of a gate material having a suitable work function. The gate electrode 102 can be formed from conventional materials, preferably including but not limited to metals, metal alloys, metal nitrides and metal silicides, as well as laminates thereof and composites thereof. In certain embodiments, the gate electrode 102 may also be formed from polysilicon, including for example highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods, and physical vapor deposition methods, such as but not limited to evaporative methods and sputtering methods. Typically, the gate electrode 102 has an overall thickness from about 1 to about 500 nanometers. In certain embodiments, metals having work functions intermediate between band edge and mid-gap can be selected. As discussed in pending U.S. patent application Ser. No. 12/960,266 filed Dec. 3, 2010, the entirety of which disclosure is hereby incorporated by reference herein, such metal gates simplify swapping of PMOS and NMOS gate metals to allow a reduction in mask steps and different required metal types for systems on a chip or other die supporting multiple transistor types.

Threshold voltage can also be modified by adjustments to lightly doped drain extensions (LDD) 113 and 115, source/drain extensions that are typically formed by out-diffusion under gate spacers. Source/drain extensions 113 and 115 slightly reduce channel length by extending the source/drain toward each other using dopant implants of the same dopant type as the source 104 and drain 106. Care must be taken to control dopant migration to keep the channel 110 extending between the extensions substantially undoped with a dopant concentration of concentration less than $5 \times 10^{17}$ dopant atoms per $cm^3$. As will be appreciated, variations in extension dimensions affect channel electrical characteristics and also result in adjustments to threshold voltage. As shown in FIGS. 1 and 2, the LDD 113 and 115 are symmetrically spaced and extending toward each other with a predetermined length that can be optionally increased or decreased to change threshold voltage. In other embodiments, asymmetrical LDD's are possible with, for example, LDD 115 being configured to extend a greater or lesser extent into the channel 110 than LDD 113, having a greater or lesser dopant density than LDD 113, or extending deeper downward or shallower than LDD 113.

Applied bias to well 114 is yet another technique for modifying threshold voltage of FET 100. The screen layer 112 sets the body effect for the transistor and allows for a higher body effect than is found in state of the art CMOS technologies. For example, a body tap 119 to the well regions 114 of the transistor elements may be formed in order to provide further control of threshold voltage. The applied bias can be either reverse or forward biased and can result in significant changes to threshold voltage. Bias can be static or dynamic and can be applied to isolated transistors or to groups of transistors that share a common well. Biasing can be static to set threshold voltage at a fixed set point or dynamic to adjust to changes in transistor operating conditions or requirements. Various suitable biasing techniques are disclosed in pending U.S. patent application Ser. No. 12/708,497 filed Feb. 18, 2010, the entirety of which is hereby incorporated by reference herein.

Figure 3:
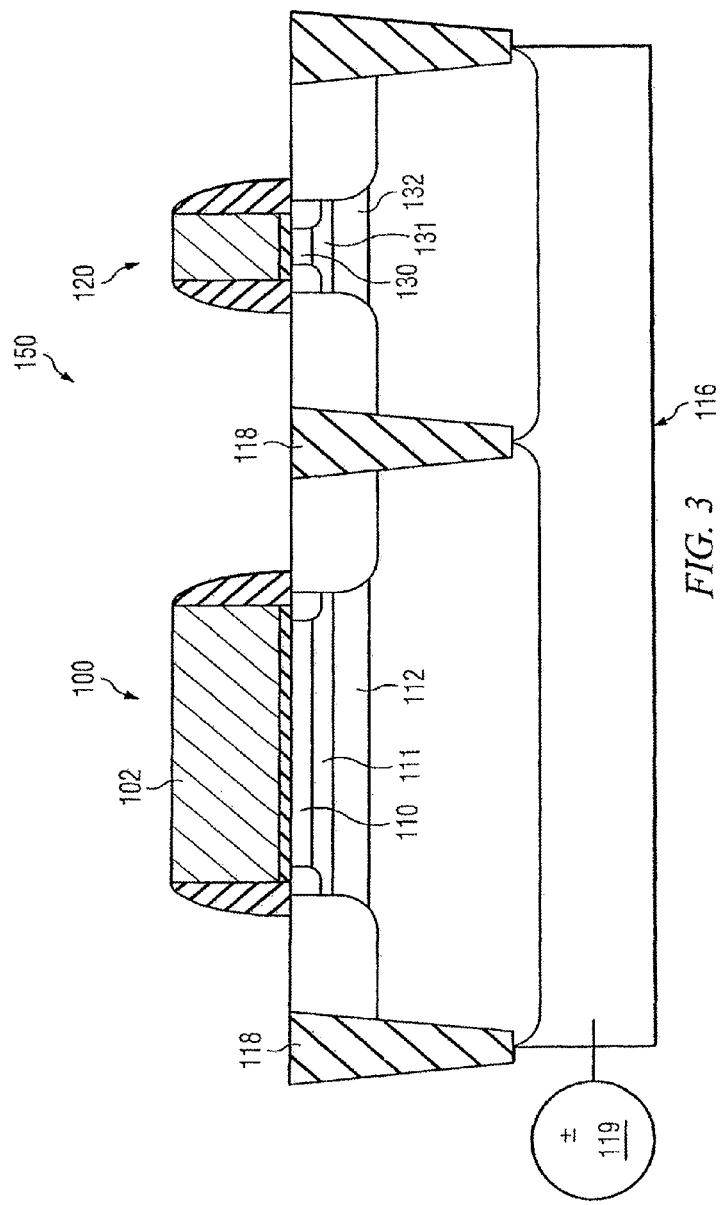
FIG. 3 illustrates a side cross sectional view of a portion of a die supporting multiple transistor types including an analog transistor such as illustrated in FIGS. 1 and 2 and a smaller analog and/or digital transistor positioned adjacent.

The problem of channel dopant contamination can become even more acute when a die supporting multiple transistor types or requiring multiple implants are manufactured. Multiple implants increase the likelihood of dopant diffusion into the channel with each implant becoming a potential source of channel contamination. Eliminating halo implants, while still being able to effectively adjust threshold voltage, greatly improves the ease of manufacturing die supporting multiple transistor types. This is seen in FIG. 3 which illustrates a portion of a multi-transistor die 150 supporting multiple transistor types, including FET 100 of FIGS. 1 and 2, formed on substrate 116 adjacent to a differently sized transistor 120 having substantially different electrical characteristics. Transistor 120 can optionally be a digital or an analog transistor, can have a higher, lower, or identical threshold voltage to FET 100, and can be formed to have a conventional doped channel (i.e. "legacy" transistor) or a substantially undoped channel 110 similar to FET 100. In the illustrated FIG. 3, transistor 120 is shown to have an undoped channel 130, a threshold voltage set layer 131, and a screen layer 132 similar to the structure of FET 100. The screen layer 132 and threshold voltage set layer 131 can be formed by blanket wafer, die, or block implants and/or epitaxial growth that simultaneously form the corresponding screen layer 112, threshold voltage set layer 111, and undoped channel 110. Shallow trench isolation structures 118 can be used to isolate transistors and bias 119 can be applied as needed. However, as will be appreciated, simultaneous layer creation is not required and masking, selective epitaxial growth techniques, and heterogeneous materials and/or implant conditions can be used to create differing types of transistors on the same die. In certain embodiments, transistors having very different electrical characteristics can be formed with the same screen layer 112 and/or threshold voltage set layer 111 or, alternatively, transistors having very different sizes can be formed to have compatible electrical characteristics based on adjustments to screen layer 112 position, threshold voltage set layer 111 presence or absence, LDD geometry and dopant concentration, and/or bias conditions.

Figure 4:
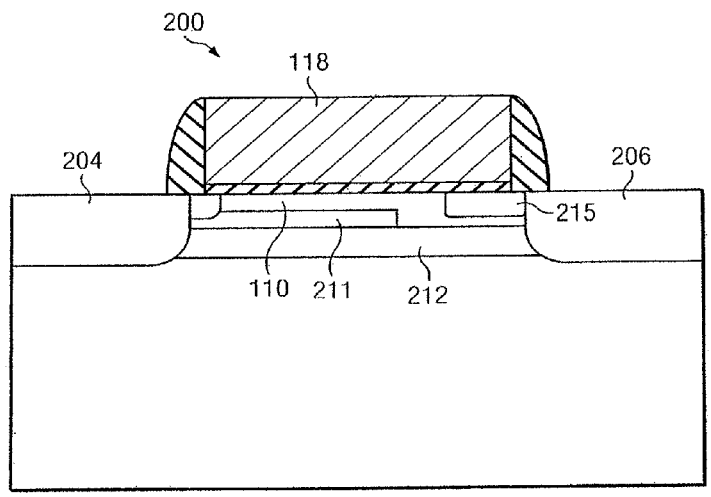
FIG. 4 illustrates an analog transistor with asymmetric threshold voltage set layers and lightly doped drains.

Exemplary asymmetric transistor structures are seen in FIG. 4 which illustrates an analog transistor 200 on substrate 216, having a source 204, a drain 206, and an asymmetric threshold voltage set layer 211 on a screen layer 212. The asymmetric threshold voltage set layer 211 only extends partially below a substantially undoped channel 210. FIG. 4 also illustrates other asymmetric structures, including lightly doped drain extensions 213 and 215 that extend differing distances into the channel 210. In addition to extending closer to a center of the gate/channel, LDD 215 is deeper and has a greater dopant density than the shallower LDD 213.

Figure 5:
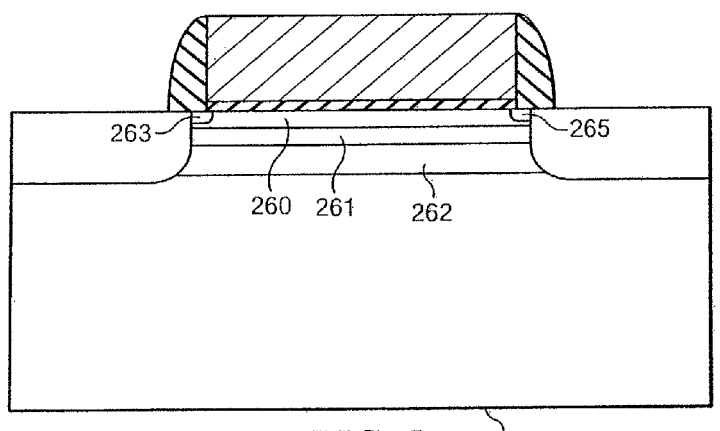
FIG. 5 illustrates an analog transistor with a counterdoped threshold voltage set layer and a reduced length drain side LDD extension to improve capacitance effects.

Another contemplated variant transistor structure is shown in FIG. 5 which illustrates an analog transistor 250 on substrate 266 with a substantially undoped channel 260 and a separate counterdoped threshold voltage set layer 261 which has a dopant type opposite to that of screen layer 262 (e.g. N-type threshold voltage set layer 261 versus P-type screen layer 262 or the opposite). This allows for reduction in threshold voltage of transistor 250 as compared to a similar transistor which has no threshold voltage set layer 111 or a transistor with a threshold voltage set layer 111 with the same dopant type as the screen layer 112. FIG. 5 also illustrates a reduced length drain side LDD 265 extension (as compared to LDD 263) which can help to improve gate/drain capacitance effects. As will be appreciated, length of LDD 265 can be slightly less than LDD 263, substantially less than LDD 263, or even absent altogether.

Figure 6:
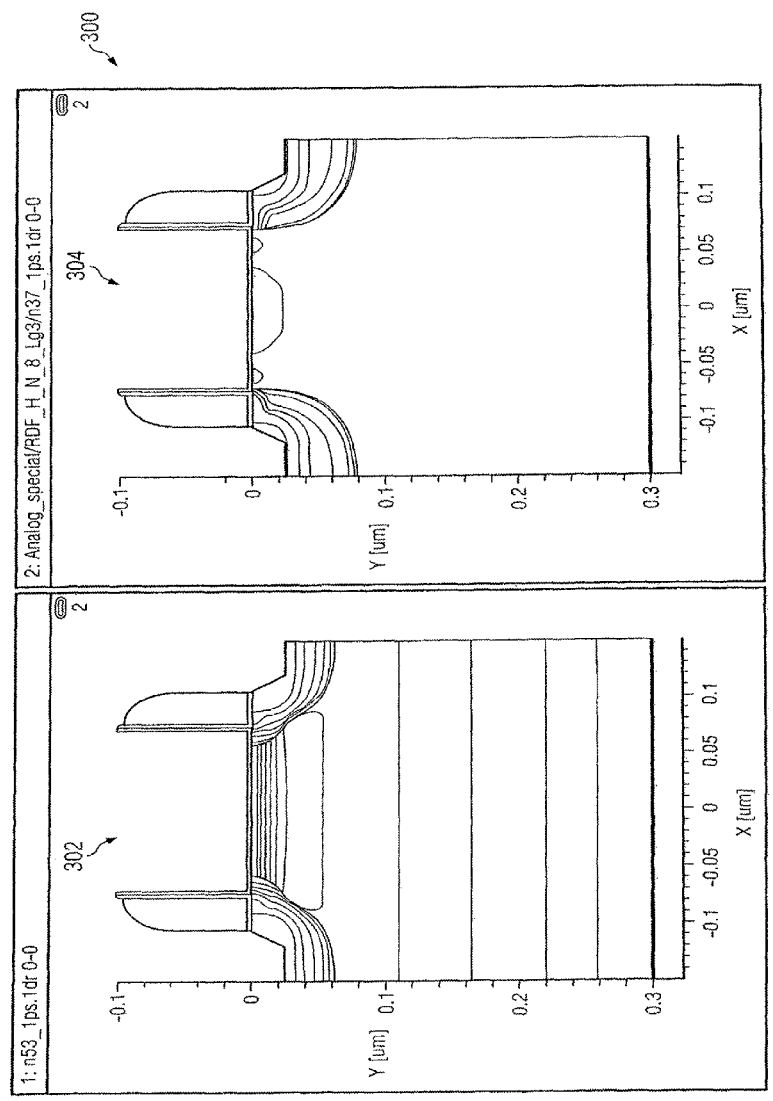
FIG. 6 illustrates the respective two-dimensional dopant profiles of a haloless undoped channel analog transistor and a similarly sized conventional transistor with a doped channel.
Figure 7:
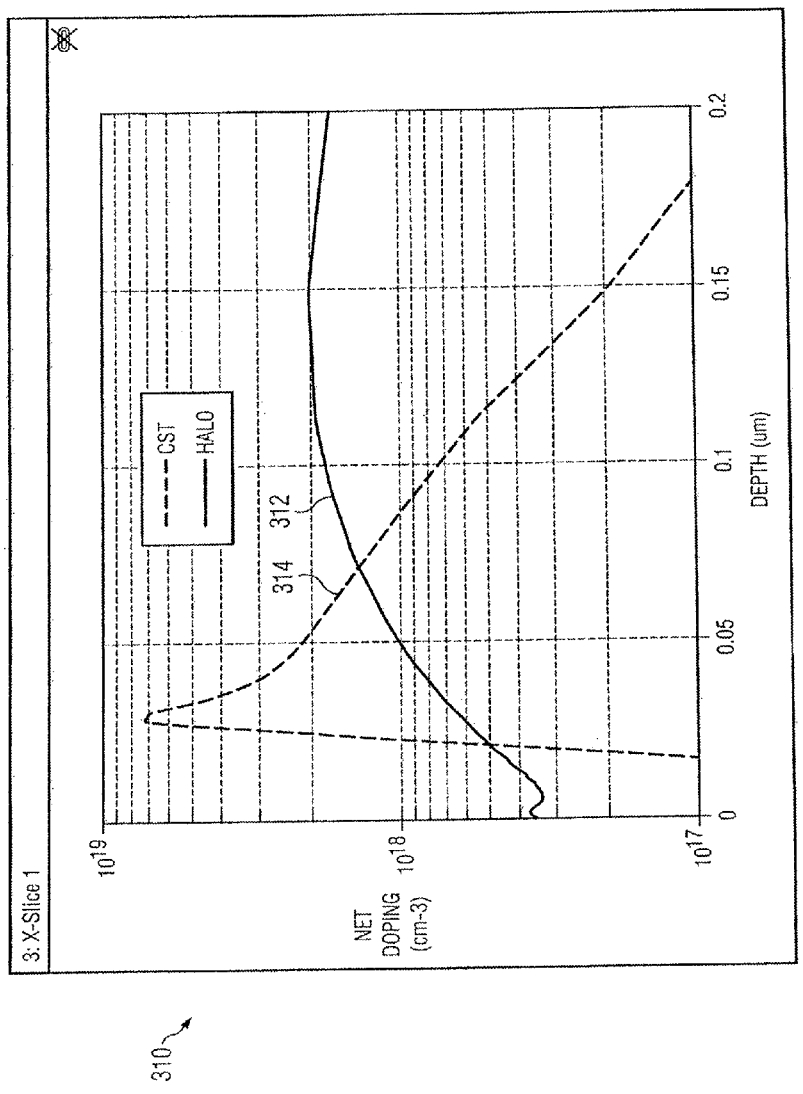
FIG. 7 illustrates a one-dimensional vertical dopant profile of a haloless undoped channel analog transistor and a similarly sized conventional transistor with a doped channel.
Figure 8:
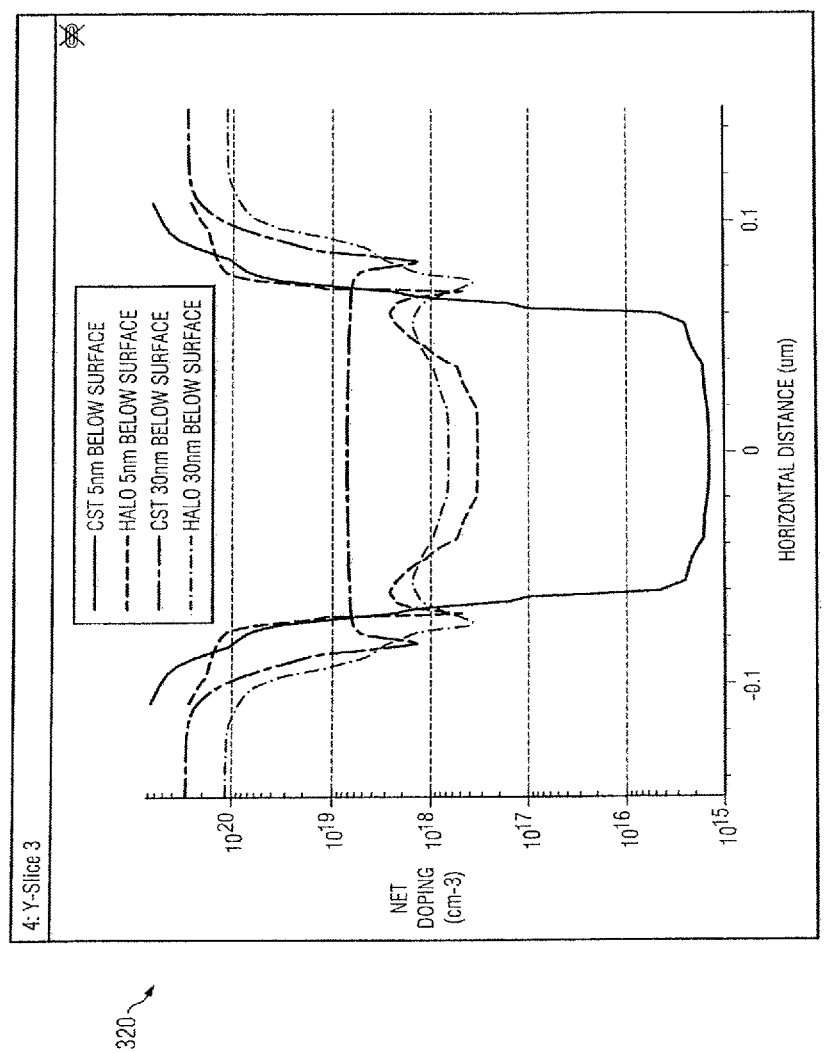
FIG. 8 illustrates a two-dimensional profile along the length of the channel for a haloless undoped channel analog transistor and a similarly sized conventional transistor with a doped channel.

To better understand the differences between conventional doped channel transistors and examples of transistors with undoped channels and haloless processing, chart 300 of FIG. 6 illustrates the respective two-dimensional dopant profiles of a haloless undoped channel analog transistor 302 and a similarly sized doped channel conventional transistor 304. The substantial differences in dopant profile through the channel, screen layer, and into the well is also illustrated by chart 310 in FIG. 7 which shows a one-dimensional vertical dopant profile of a haloless undoped channel analog transistor 314 and a similarly sized conventional transistor 312 with a doped channel. In addition, FIG. 8 is a chart 320 illustrating a two-dimensional profile along the length of the channel for a haloless undoped channel analog transistor and a similarly sized conventional transistor with a doped channel.

Figure 9:
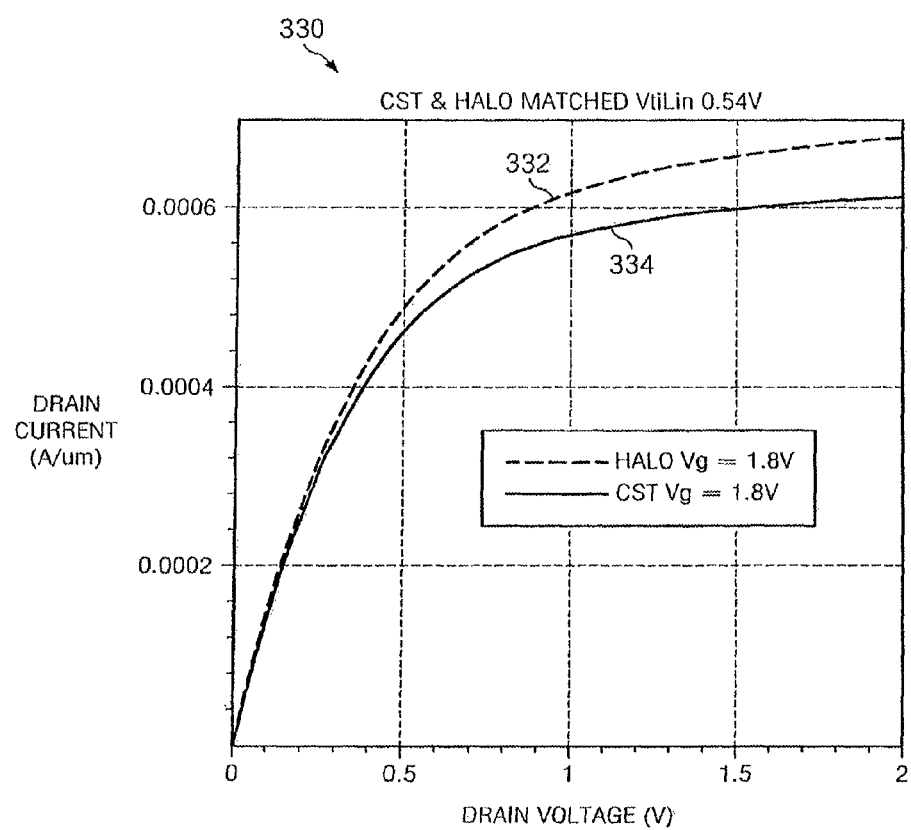
FIG. 9 illustrates I-V curves (drain current versus drain voltage) for a haloless undoped channel analog transistor and a similarly sized conventional transistor with a doped channel.
Figure 10:
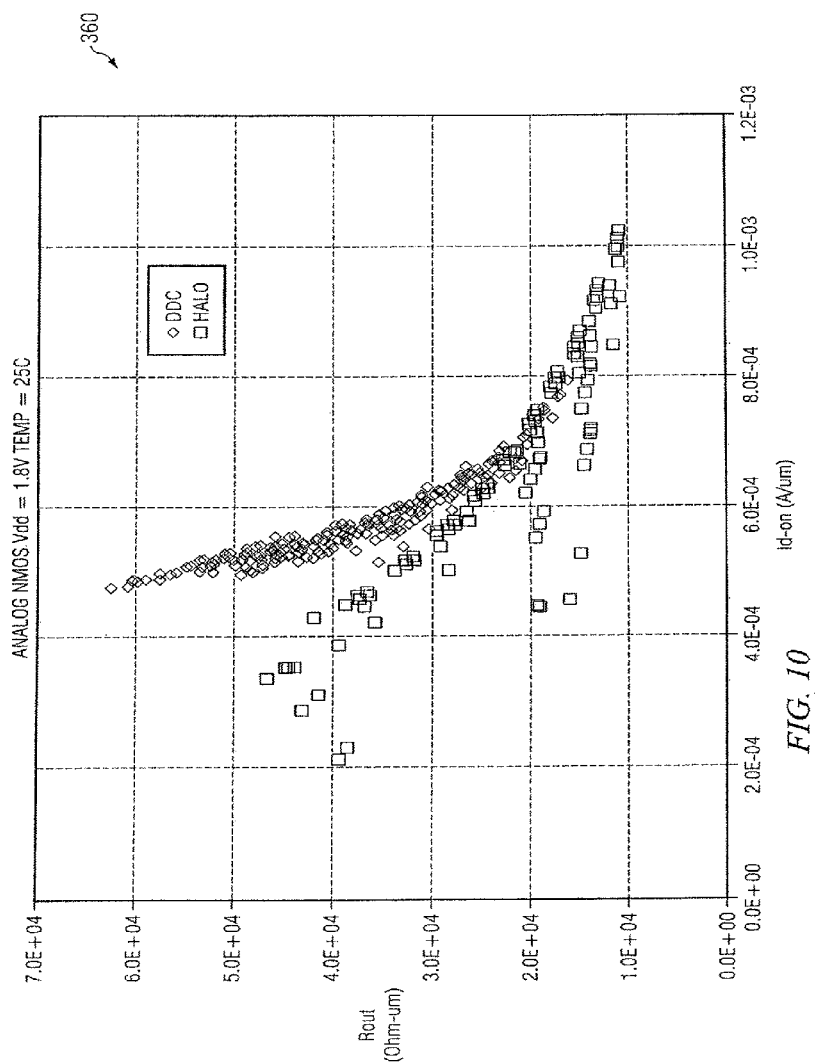
FIG. 10 illustrates simulation runs comparing $R_{out}$ to Id-on for undoped channel and screen layer supported deeply depleted (DDC) analog transistors and conventional channel implant and halo processed devices.

Operational differences between undoped channel transistors and conventional doped channel transistors are illustrated by FIGS. 9 and 10. FIG. 9 is a chart 330 illustrating I-V curves (drain current versus drain voltage) for haloless undoped channel analog transistor 334 and a similarly sized conventional transistor 332 with a doped channel. The improved flatter response of the undoped channel transistor 334 is apparent. As another example, FIG. 10 is a chart 360 illustrating simulation runs comparing $R_{out}$ to Id-on for undoped channel and screen layer supported haloless undoped channel analog transistors and conventional channel implant and halo processed devices. The increased $R_{out}$ and decreased variation in $R_{out}$ for a range of drain currents (Id-on) is shown.

Figure 11:
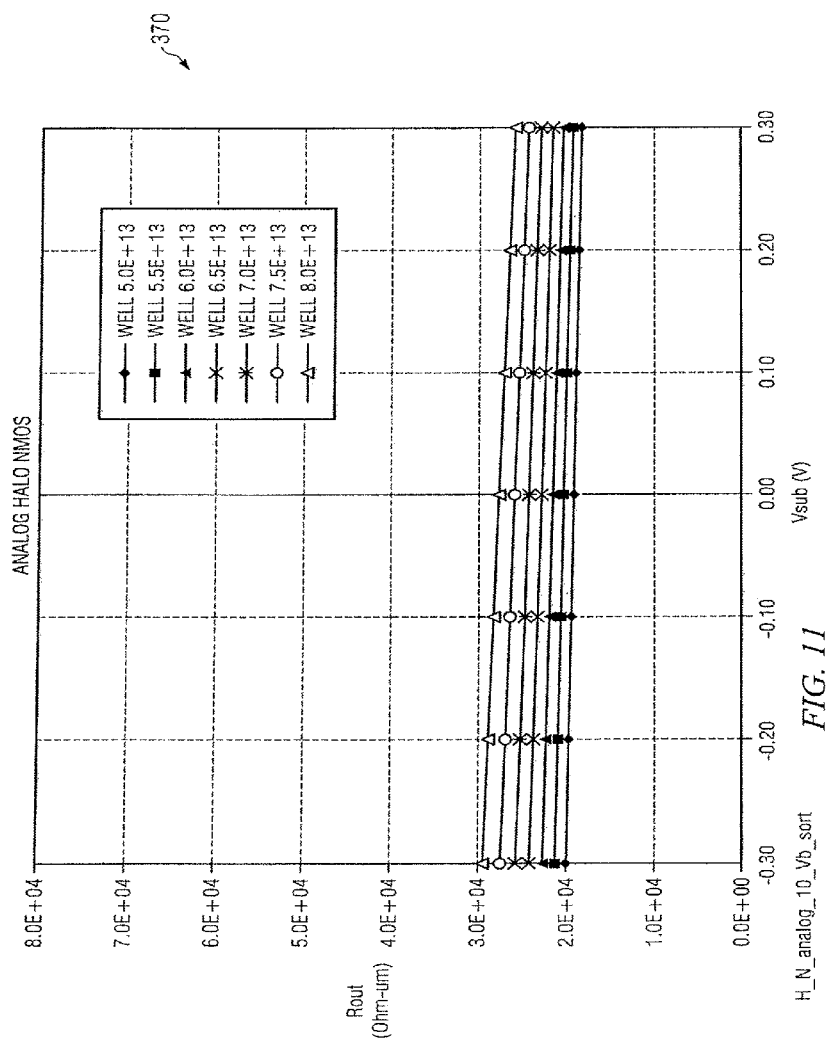
FIG. 11 illustrates simulation runs comparing $R_{out}$ for a range of reverse and forward biased voltages of conventional channel dopant implanted and halo processed devices.
Figure 12:
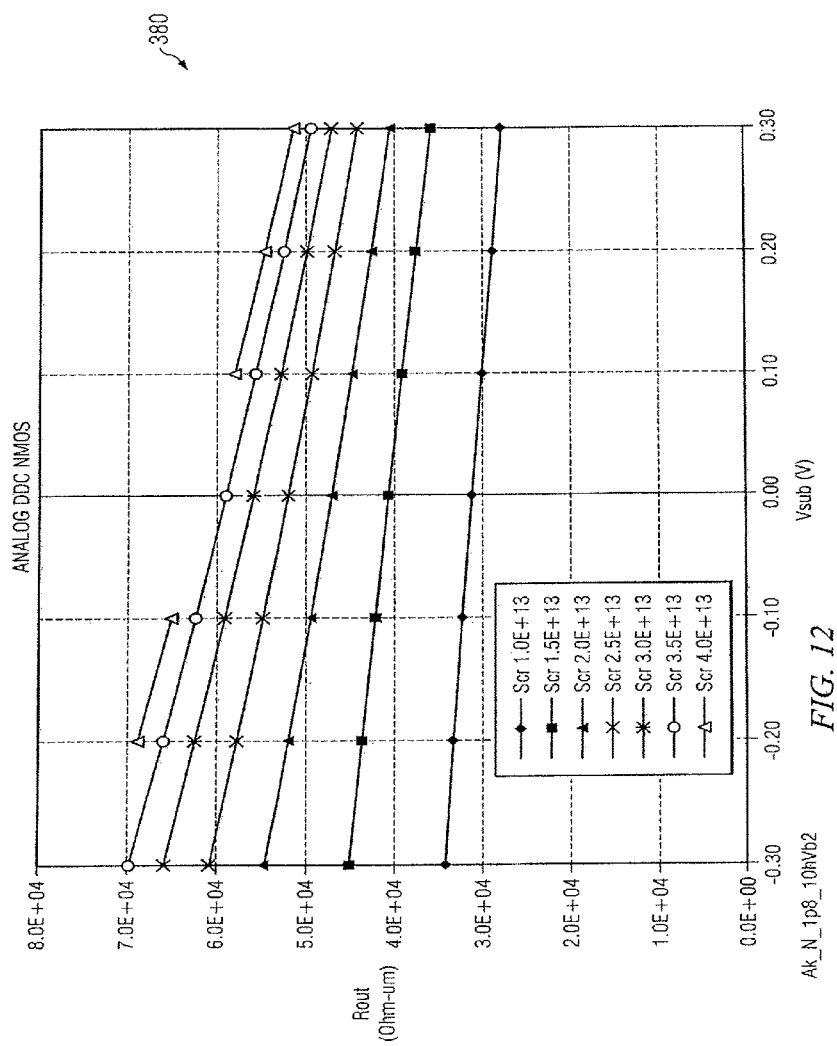
FIG. 12 illustrates simulation runs comparing $R_{out}$ for a range of reverse and forward biased voltages for haloless undoped channel and deeply depleted (DDC) analog transistors.

The output resistance $R_{out}$ for analog transistors is a key parameter for determining circuit performance and adjustments to $R_{out}$ can significantly change circuit efficiency and power requirements. Unfortunately, changing $R_{out}$ with the combination of biasing and process variations such as well dopant implant concentration changes can be difficult. This is seen in chart 370 of FIG. 11 which is a simulation illustrating minimal changes in $R_{out}$ for a wide range of reverse and forward well substrate bias voltages even with increasing well dopant density for an NMOS analog transistor with halo implants and a doped channel. In contrast, FIG. 12 is a chart 380 illustrating a substantial increase in $R_{out}$ range that is possible with reverse or forward bias voltages and shows dramatic changes with increasing or decreasing screen dopant density. This simulation uses an NMOS analog transistor similar to that simulated in FIG. 11 except for the additional screen layer and use of an undoped channel.

Transistors created according to the foregoing embodiments will have a reduced mismatch as compared to conventional MOS transistors. As will be understood, analog transistors are often larger than digital transistors, since analog transistors and circuits are more affected by $V_t$ mismatch between identical devices. This $V_t$ variation, due in part to process variations in line etch roughness, oxide thickness, or gate granularity as well as more fundamental limitations such as random dopant fluctuations in nanometer sized channels, is more controllable for larger transistors. Fortunately, $V_t$ mismatch in small transistor devices built with a screen layer 112 and an undoped channel 110 as described herein can effectively increase headroom which the devices have to operate. This allows high-bandwidth SoC devices with improved sensitivity and performance through improved $V_t$ matching and reduction in variation due to random dopant fluctuations that affect carrier mobility, capacitance, and other channel dependent transistor characteristics.

As will be understood, wafers and die supporting multiple transistor types, including those with and without the described dopant structures, those having different threshold voltages, and with and without static or dynamic biasing, are contemplated. Electronic devices that include the disclosed transistor structures can incorporate a die configured to operate as "systems on a chip" (SoC), advanced microprocessors, radio frequency, memory, and other die with one or more digital and analog transistor configurations and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking, or through use of 3D wafer bonding or packaging. According to the methods and processes discussed herein, a system having a variety of combinations of analog and/or digital transistor devices, channel lengths, and strain or other structures can be produced on silicon using planar bulk CMOS processing techniques. In different embodiments, the die may be divided into one or more areas where dynamic bias structures, static bias structures, or no-bias structures exist separately or in some combination.

Although the present disclosure has been described in detail with reference to a particular embodiment, it should be understood that various other changes, substitutions, and alterations may be made hereto without departing from the spirit and scope of the appended claims. Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

The invention claimed is:
1. A process for manufacturing an analog transistor comprising:
    providing a doped well;
    forming a screen layer that contacts and overlies at least a portion of the doped well;
    forming an epitaxial undoped channel layer above the screen layer, and the undoped channel not being subjected to contaminating threshold voltage implants or halo implants;

forming a gate dielectric and gate electrode above the undoped channel and positioned between a source and a drain, the source and drain configured to respond to an analog signal; and maintaining process conditions so that a portion of the undoped channel adjacent to the gate dielectric remains undoped in the final analog transistor.

2. The process of claim 1, further comprising the step of forming a threshold voltage setting layer positioned between the substantially undoped channel and the screen layer.

3. The process of claim 2, further comprising the step of counter doping the threshold voltage setting layer with respect to the screen layer.

4. The process of claim 2, further comprising the step of forming an asymmetric threshold voltage setting layer that extends only partially between the source and the drain.

5. The process of claim 4, wherein the threshold voltage setting layer that extends from the source to a position below the substantially undoped channel short of the drain.

6. The process of claim 2, wherein the threshold voltage setting layer is formed by out diffusion from the screen layer into an epitaxially grown layer.

7. The process of claim 2, wherein the threshold voltage setting layer is formed by growing an epitaxial layer on the screen layer and doping the epitaxial layer through either implantation or in-situ doping.

8. The process of claim 2, wherein the threshold voltage setting layer is formed by delta doping to form an offset doped plane.

9. The process of claim 2, wherein the threshold voltage setting layer is formed as part of a blanket layer underlying a plurality of gate dielectrics and gate electrodes.

10. The process of claim 2, further comprising:
forming a dopant migration resistant layer above the threshold voltage setting layer.

11. The process of claim 2, further comprising:
forming a first dopant migration resistant layer above the threshold voltage setting layer;
forming a second dopant migration resistant layer above the threshold voltage setting layer.

12. The process of claim 1, further comprising the steps of:
forming a first channel LDD extending from the source toward the drain; and
forming a second channel LDD extending from the drain toward the source.

13. The process of claim 12, wherein the first channel LDD extends a different distance than the second channel LDD.

14. The process of claim 12, wherein the first channel LDD has a greater depth than the second channel LDD.

15. The process of claim 12, wherein the first channel LDD has a greater dopant density than the second channel LDD.

16. The process of claim 1, further comprising the step of depositing the gate metal of the gate electrode, wherein the gate metal is selected to have a work function intermediate between band edge and midgap.

17. The process of claim 1, further comprising the step forming an electrical tap to the doped well to permit biasing that adjusts threshold voltage.

18. The process of claim 1, wherein the screen layer is formed as part of a blanket layer underlying a plurality of gate dielectrics and gate electrodes.

19. The process of claim 1, wherein the screen layer is formed by epitaxial growth subject to at least one of implantation and in situ doping.

20. The process of claim 1, wherein the screen layer is positioned above the bottom of the source and drain.

* * * * *